MATRIX SWITCH UTILIZING MAGNETIC STRUCTURES AS CROSSPOINTS

Original Filed Nov. 4, 1958 2 Sheets-Sheet 1

INVENTOR
E. E. SCHWENZFEGER
BY Donald M Luft
ATTORNEY

MATRIX SWITCH UTILIZING MAGNETIC STRUCTURES AS CROSSPOINTS

Original Filed Nov. 4, 1958 2 Sheets-Sheet 2

INVENTOR
E. E. SCHWENZFEGER
BY Donald M Duft
ATTORNEY

United States Patent Office

Re. 26,313
Patented Nov. 28, 1967

26,313

MATRIX SWITCH UTILIZING MAGNETIC STRUCTURES AS CROSSPOINTS

Edward E. Schwenzfeger, Atlantic Highlands, N.J., assignor to Bell Telephone Laboratories, Incorporated, New York, N.Y., a corporation of New York Original No. 3,099,752, dated July 30, 1963, Ser. No. 771,924, Nov. 4, 1958. Application for reissue Sept. 18, 1964, Ser. No. 410,339
11 Claims. (Cl. 307—88)

Matter enclosed in heavy brackets [ ] appears in the original patent but forms no part of this reissue specification; matter printed in italics indicates the additions made by reissue.

*ABSTRACT OF THE DISCLOSURE*

*A matrix switch is disclosed which uses magnetic elements as crosspoints to interconnect the horizontal and vertical switch multiples. Each magnetic elements has two signal windings which are normally nonflux-connected. The application of control signals to a conductor in a selected horizontal and a selected vertical multiple alters the flux path of the magnetic element at their common crosspoint and thereby flux connects its two signal windings. This effectively closes the crosspoint and interconnects the two selected conductor multiples.*

Figure 1A:
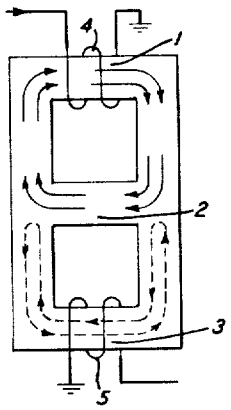

This invention relates to a matrix switch and more particularly to a matrix switch using magnetic elements at crosspoints.

The increasing use of data switching systems and other complex communication systems in which intelligence is transmitted from one point to another makes highly desirable the provision of improved switching arrangements for connecting a selected one of a plurality of conductors in a first group to a selected one of a plurality of conductors in a second group. At the present time, switching operations of this type are often performed with the aid of electromechanical devices such as relays, Strowger type step-by-step switches or crossbar switches. Although these devices are well suited for the purposes for which they were designed, i.e., for use in relay switching systems, none of them are ideally suited for use with electronic switching systems for several reasons. First of all, the operate time of these devices is usually in the order of milliseconds while electronic switching systems can easily complete a switching function in a few microseconds. Secondly, the relatively large current requirements of these devices makes them unsuitable for use with the low current components used in electronic systems such as, for example, transistors, magnetic cores, et cetera.

It is an object of the invention to provide an improved switching means for interconnecting a selected conductor in a first group of conductors to a selected conductor in a second group of conductors.

It is a further object of the invention to provide an improved switching means having a fast operate time and low current requirements for interconnecting a selected conductor in a first group of conductors to a selected conductor in a second group of conductors.

In accordance with the present invention, a plurality of magnetic elements are utilized as crosspoint elements in a matrix switch. Each element has two signal windings and a clamping winding. The two signal windings are normally non-flux connected so that a signal applied to one will not be induced in the other. However, when a current of sufficient magnitude is caused to flow through the clamping winding, the flux paths are altered to link the two signal windings fluxwise, thereby causing a signal applied to one to be induced in the other.

Each mangetic element is ladder shaped in that it may be said to have three rungs and two side rails. The two end rungs each have a signal winding thereon while the clamping winding is on the middle rung. Each element also has two states, a clamped and an unclamped state.

A voltage applied to a signal winding produces a signal flux in its associated end rung. In the normal or unclamped state (no current flowing through the clamping winding) the path for this signal flux is completed through one side rail, the middle rung, the other side rail, and back to the same end rung. Thus, in this condition, the flux induced by a signal winding completes its return path through the middle rung and does not travel through the distant end rung to induce a voltage in the other signal winding. If, however, the clamping winding is energized to saturate the middle rung fluxwise, the signal flux induced in an end rung cannot flow through the middle rung and therefore, will be forced to complete its return path via the distant end rung, thereby inducing a voltage in the other signal winding.

It may be seen that each magnetic element comprises a switch which either connects or disconnects the two signal windings from each other fluxwise. When the two are so connected, a signal applied to one will be induced in the other and conversely, when the two are disconnected, a signal applied to one signal winding will not be induced in the other. The clamping winding is the controling element and the absence or presence of saturation current therein determines whether the switch is to be opened or closed.

A plurality of the above-described magnetic elements are arranged in a matrix configuration having rows and columns. The top rung signal windings common to a row are connected in series as are the bottom rung signal windings common to a column. Also, a plurality of control buses are provided, one for each row and one for each column. Each magnetic element has one side of its clamping winding connected to the control bus for its row while the other side of its clamping winding is connected to the control bus for its column.

An input signal applied to the series circuit comprising the top rung signal windings for a certain row will cause a flux to be induced in the top rungs of the magnetic elements common to the row. However, if all elements in this row are in their unclamped state, none of the signal flux will travel through the bottom rungs and therefore, no voltage will be induced in any of the bottom rung signal windings of this row.

When it is desired to close a particular crosspoint, appropriate potentials are applied to the horizontal and vertical control buses common to this crosspoint, thereby energizing its clamping winding. Once clamping current is flowing through this particular crosspoint, the application of a signal to the series circuit comprising the top rung signal windings of the row containing this crosspoint will cause the induced signal flux to travel from the top rung of this crosspoint, through the bottom rung and back around to the top rung, thereby inducing a similar signal in the bottom rung signal winding. The signal induced in the bottom rung winding appears on the signal lead for the column associated with this crosspoint.

Since the top rung signal windings for each row are connected in series, the flux induced in the top rung of the closed crosspoint will likewise be induced in the top rung of each open crosspoint in the same row. However, these other crosspoints are in an unclamped condition at this time, and therefore, this flux will complete a return path for itself through the middle rungs and will induce no output potential in the bottom rung windings.

It may be seen that the present invention comprises the electronic equivalent of the well known crossbar switch in that it provides for the interconnection of any one of a plurality of wires in a first group with any one of a plurality of wires in a second group. Further, the elements used to accomplish this have an operate time and power requirements that are fully compatible with the components comprising the present day electronic switching systems.

A feature of the invention is the use of a magnetic element having selectively controllable flux paths as a crosspoint of a matrix switch.

A further feature of the invention is the provision of a plurality of magnetic elements each having a pair of signal windings in combination with means whereby upon the application of a signal to one winding of each element simultaneously means are effective to provide a signal output from the other winding of only one of said elements.

A further feature of the invention is the provision of a plurality of magnetic elements each having a first and a second signal winding and a clamping winding together with means effective when a signal input is applied simultaneously to one winding of each element for controlling the clamping winding of all elements to determine which element shall have its signal windings linked fluxwise whereby an output signal appears on the other signal winding of only this element.

A further feature of the invention is the provision of a plurality of magnetic elements arranged in a matrix configuration and each having a plurality of signal windings whereby upon the application of an input signal to all the elements in a given row, an output signal appears on the other signal winding of only a selected one of the elements in said row.

A further feature of the invention is the provision of a plurality of magnetic crosspoints arranged into columns and rows and each having a plurality of signal windings with the first signal winding of all crosspoints being connected in series for each row and with the second signal winding common to a column being connected in series together with means whereby upon the application of a signal input to one of the series circuits common to a row an output signal is received by only one of the series circuits common to a column.

A further feature of the invention is the provision of a three-dimensioned matrix switch having a plurality of magnetic elements as crosspoints in combination with means whereby the elements may be selectively controlled to effect the interconnection of a plurality of conductors in a first group with a plurality of conductors in a second group.

Figure 1B:
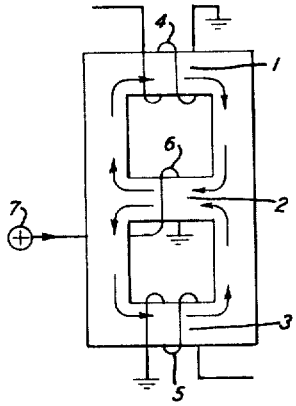
Figure 1C:
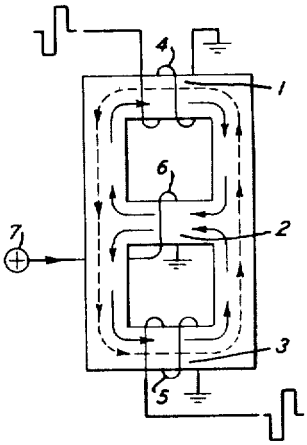
Figure 2:
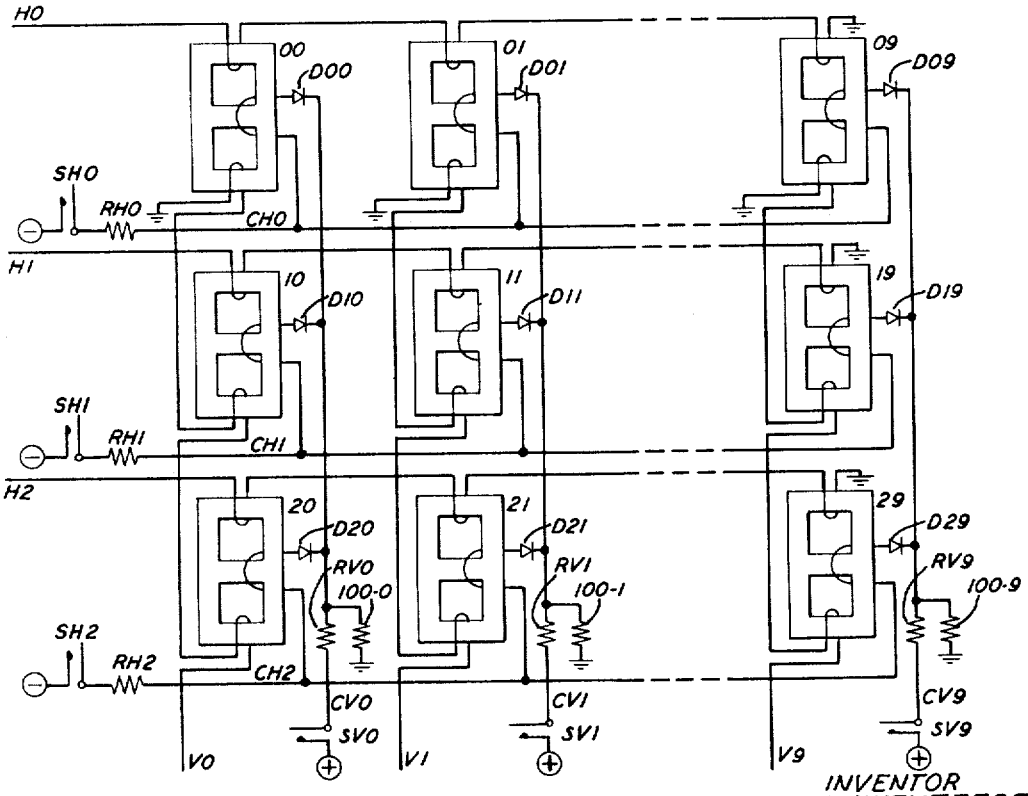
Figure 3:
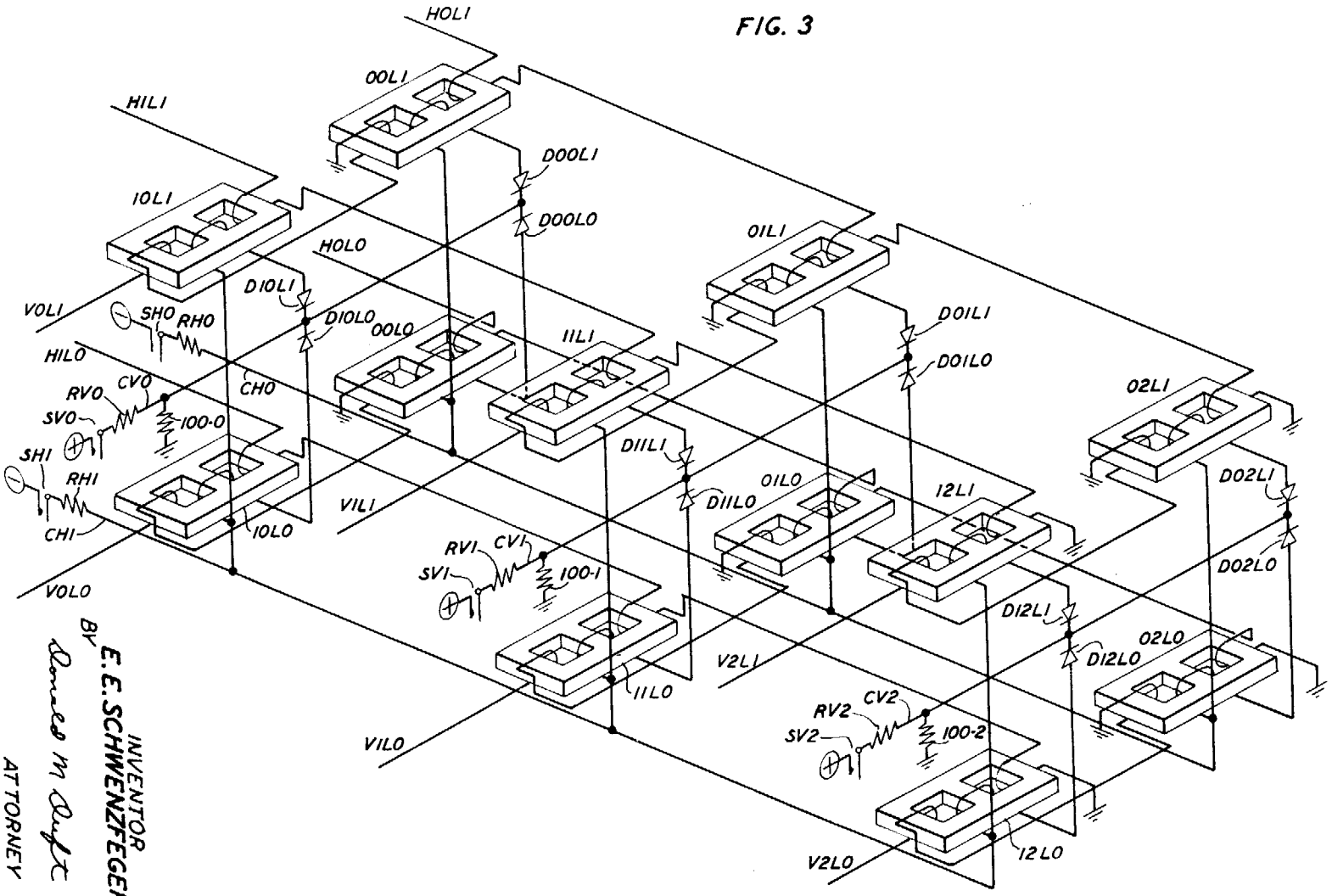

These and other objects and features of the invention will be more readily understood when read in connection with the following detailed description and drawings in which:

FIGS. 1A, 1B and 1C disclose the magnetic structures used as crosspoint elements in the matrix switch comprising the present invention;

FIG. 2 discloses a circuit utilizing a plurality of these magnetic elements and comprising a matrix switch; and FIG. 3 discloses a circuit utilizing a plurality of these magnetic elements as a three-dimensional matrix switch.

Inasmuch as the matrix switch of the present invention utilizes magnetic elements which are relatively new in the art, the first portion of this description comprises a brief and simplified description of characteristics of these elements. From the drawings it may be seen that these elements are ladder shaped in that they have a top, a middle and a bottom rung together with two side rails. The side rails and all of the rungs are equal in minimum cross-sectional area so that all flux paths within the device have the same flux carrying capacity. Also, as is generally true in magnetic structures, all flux induced in these elements always seeks to complete a return path for itself by the shortest available flux path.

Referring to FIG. 1A, let it be assumed that a current is caused to flow through the top rung winding 4 to orient the flux in the top rung clockwise as shown by the arrows. Experiments have revealed that the flux induced in the top rung by current in winding 4 will complete a path for itself through the upper half of the right-hand side rail, through the middle run, through the upper half of the left-hand side rail and back to the top rung. Inasmuch as this flux always utilizes the closest available return path, and, due to the fact that all rungs are equal in cross-sectional area, little or none of the flux induced in the top rung by the current through winding 4 will flow through the bottom rung. The unmagnetized state of that part of the device comprising the lower rung together with the lower portion of the two side rails is represented by the dotted arrows which complete a closed path for themselves.

In summary, insofar as concerns the embodiment of FIG. 1A, it may be seen that the signals applied to winding 4 will not be induced in winding 5 since the two windings are not flux connected.

Let us now take the embodiment of FIG. 1A and to it add a clamping winding 6 on the middle rung. Let it be assumed that no signals are applied to either of windings 4 or 5 and that a current is caused to flow through clamping winding 6 so as to saturate the middle rung in the direction shown by the arrows. The top and bottom rungs are of equal distance from the middle rung and therefore, the flux induced in the middle rung finds two equally accessible return paths for itself. As a result, half of this flux is completed via the top rung while the other half is completed via the bottom rung. Thus, while the clamping current is applied, the top rung is half saturated, the middle rung is fully saturated, and the bottom rung is half saturated.

The embodiment of FIG. 1C is similar to that of FIG. 1B except that a signal is applied to winding 4 while clamping current is applied to winding 5. The flux developed by the clamping current continues to flow equally through the top and bottom rungs. This is shown in FIG. 1C as it was in FIG. 1B with the solid clockwise arrows around the upper aperture representing the half of the clamping flux which flows through the top rung while the solid counterclockwise arrows around the lower aperture represent the flux flowing through the bottom rung. Let it be assumed that the signal now applied to winding 4 induces a signal flux in the unsaturated portion of the top rung in the direction indicated by the dotted arrows. This flux travels down the left side rail to the middle rung which is currently unavailable as a return path since it is held saturated by the clamping current. Therefore, the signal flux continues its downward travel until it meets the lower rung. A return path is available through this rung since it is only half saturated at this time by the clamping current. The signal flux from winding 4 flows through this rung and up the right side rail, and returns to the top rung. The signal flux flowing through the bottom rung is identical to that induced in the top rung and therefore, a signal voltage is induced in the bottom rung winding 7 which is identical to that applied to the winding 4.

If the signal applied to winding 4 reverses in polarity, the dotted arrows representing the signal flux also reverse in direction. The flux induced by the reversed signal polarity is also unable to complete a return path through the middle rung and, for the same reason, completes its return path through the bottom rung and induces a similar signal in winding 5.

From the above it may be seen that any signal applied to winding 4 during the time the middle rung is held saturated produces a flux change in the top rung which, due to the unavailability of the middle rung as a flux path, produces a corresponding flux change in the lower rung. Since the flux changes in the top and bottom rungs are equal, the same signal applied to winding 4 is induced in winding 5 of the bottom rung.

In summary, it may be seen that the device of FIG. 1C acts as a switch to connect or disconnect windings 4 and 5 fluxwise with the current through the clamping winding being the determining factor as to whether the two signal windings are to be connected or disconnected.

The preceding discussion is intended only as a brief and simplified description of the characteristics of the magnetic structures utilized as crosspoint elements in the present invention. Reference is made to the T. H. Crowley-U. F. Gianola U.S. Patent No. 2,963,591, issued December 6, 1960, for a more sophisticated treatment of this subject.

FIG. 2 discloses the circuit of a matrix switch utilizing the magnetic structure of FIG. 1C as crosspoint elements. This switch has thirty crosspoints contained in three rows and ten columns. Crosspoints 00 through 09 comprise the top row of the switch, crosspoints 10 through 19 the middle row, and crosspoints 20 through 29 the bottom row.

The top rung windings in each row are connected in series between one of conductors H0, H1 or H2 and ground. For example, the top rung windings of row 0, crosspoints 00 through 09, are connected in series between conductor H0 and ground. The bottom rung windings common to a column are also connected in series between one of conductors V0 through V9 and ground. Thus, the bottom rung windings of column 0 are connected in series between ground and conductor V0.

A plurality of control conductors are provided, one for each row and one for each column. The control conductors associated with the rows are designated CH0 through CH2 while the control conductors associated with the columns are designated CV0 through CV9. The clamping winding of each crosspoint is connected in series with a diode between the control conductor for its row and the control conductor for its column. For example, the clamping winding of crosspoint 00 is connected from control conductor CH0 in series with diode D00 to control conductor CV0.

Make contacts SH0 through SH2 respectively, when closed, connect a negative potential to conductors CH0 through CH2 respectively, through resistors RH0 through RH2, respectively. Similarly, make contacts SV0 through SV9 respectively, when closed, connect conductors CV0 through CV9 respectively, in series with resistors RV0 through RV9 respectively, to a source of positive potential. Resistors 100–0 through 100–9 provide a path to ground for each of conductors CV0 through CV9.

In order to describe the operation of the switch, let it first be assumed that a signal is applied to horizontal conductor H0 at the time when all crosspoints are in an unclamped condition. The signal applied to conductor H0 effects a current flow from conductor H0 to ground through the series circuit comprising the top rung windings of crosspoints 00 through 09. This current induces a signal flux in the top rung of each of these crosspoints. Since it has been assumed that all crosspoints are in an unclamped condition, the signal flux induced in each top rung at this time completes a return path for itself through the middle rung. This leaves the flux in the bottom rung of each of crosspoints 00 through 09 in an unchanged condition so that no signal is induced in their bottom rung windings.

Similarly, if a signal were applied to conductor V0 instead of H0, the induced signal flux in the lower rungs of the crosspoints in column 0 would complete a return path for itself through the middle rung and thereby leave the flux in the top rung in an unchanged condition so that no signal would be induced in any top rung winding in column 0. The same is true with respect to the crosspoints in all of the other rows and columns so that the application of a signal to any of conductors H1, H2, V1 through V9 will not induce a corresponding signal in the opposite end rung winding of any crosspoint since all crosspoints have been assumed to be in an unclamped position.

Let it now be assumed that it is desired to effect a closure of crosspoint 11 in order to connect conductors H1 and V1 signalwise. Make contacts SH1 and SV1 are closed in order to effect this interconnection. The closure of these contacts completes a path from negative potential through contacts SH1, resistor RH1, the clamping winding of crosspoint 11, diode D11, resistor RV1, contacts SV1, to a source of positive potential. The diodes associated with the crosspoints are of the breakdown type, such as, for example, Zener diodes or cold cathode gas tubes, whereby no conduction takes place until a sufficiently large breakdown voltage is applied across the diode, after which time a much lower voltage will sustain conduction therethrough. If Zener diodes are used, reverse breakdown and conduction potentials should be applied as shown on FIG. 2. If gas tube diodes are used, the polarity of the breakdown and conduction potential is immaterial since such tubes may be ionized by the application of either a forward or a reverse voltage. The closure of contacts SH1 and SV1 places a sufficiently large potential across diode D11 to effect its breakdown. Contacts SV1 are opened subsequent to the breakdown of diode D11 and the path for the sustaining current then includes resistor 100–1 rather than resistor RV1 and contacts SV1. The current flowing from the negative potential on closed contacts SH1 through the above-described path to ground on resistor 100-1 is sufficient to maintain saturation in the middle rung of crosspoint 11.

A signal applied to conductor H1 at this time induces a signal flux in the top rung of each of crosspoints 10 through 19. This flux effects no corresponding signal flux in the lower rungs of any of crosspoints 10 and 12 through 19 for the reasons already described since all of them are in an unclamped position. However, the signal flux induced in the top rung of crosspoint 11 finds the middle rung unavailable as a return path due to its saturated condition and, therefore, completes a return path for itself through the bottom rung. The flux change in the bottom rung, due to the applied signal on conductor H1, induces a corresponding signal in the bottom rung winding of crosspoint 11. This induced signal is applied through the bottom rung windings of the other crosspoints of column 1 to conductor V1. Similarly, any signals applied to conductor V1 would, by the same considerations, cause an output signal to be applied only to the top rung winding of crosspoint 11 and only to conductor H1. The clamping current is maintained in crosspoint 11 for as long as it is desired to maintain communication between conductors H1 and V1.

At the same time conductors H1 and V1 are interconnected, additional interconnections can be made between conductors H0, H2 and any of the remaining conductors V0, and V2 through V9. For example, switches SH2 and SV9 could be closed to energize the clamping winding of crosspoint 29, thereby interconnecting conductors H2 and V9 signalwise.

The above operation of switches SH2 and SV9 only effects a closure of crosspoint 29. Crosspoint 19 does not close at this time even though switch SH1, which was previously operated, remains operated while switch SV9 is operated. Crosspoint 19 is not closed due to the fact that resistors RH0 through RH2 comprise lockout circuits which permit only a single crosspoint per row to be closed at any given instant of time.

These lockout circuits work in the following manner. Referring to conductor CH1 for example, the full negative supply potential is applied to it immediately after the closure of switch SH1 and prior to the breakdown of diode D11. However, after diode D11 breaks down, the flow of the resulting clamping current produces an IR drop across resistor RH1 which raises the potential on conductor CH1 in the positive direction sufficiently so that the closure of any further column switches cannot effect the breakdown of any additional diodes in row 1.

Thus, the closure of switches SH2 and CV9, after crosspoint 11 has been closed, closes crosspoint 29 but does not close crosspoint 19 since the potential across diode D19 is insufficient to break it down.

Contacts SH1 are opened when it is desired to open crosspoints 11 to disconnect conductors H1 and V1 signalwise. The opening of contacts SH1 removes the clamping current from crosspoint 11 so that any subsequent signals applied to conductor H1 will not appear on conductor V1, or vice versa, since the signal flux produced thereby will now complete a return path for itself via the middle rung.

In summary, it may be seen that the use of the magnetic elements shown herein as crosspoints in a matrix switch provides a new and novel means for selectively interconnecting any one of a plurality of conductors in a first group with any selected one of a plurality of conductors in a second group. Further, the circuit used to accomplish this function has an operate time and power requirements that are fully compatible with the component elements of present day electronic switching systems.

Contacts SH0 through SH2 and SV0 through SV9 have been shown as conventional contacts in order to facilitate an understanding of the invention. However, when incorporating the principles of the present invention into an electronic switching system, the function of these contacts could advantageously be performed by some sort of an electronic switch, such as, for example, a gas tube, a vacuum tube or a transistor.

A plurality of the embodiments of FIG. 2 could be arranged to form a three-dimensional matrix switch in the event it should be desired to connect a selected subgroup of conductors in a first group to a selected subgroup of conductors in a second group. In this case, all conductors in a subgroup would have their clamping windings connected in parallel. Thus, if each of conductors H0 through H2 and V0 through V9 represented twelve wires, the resultant switch would have twelve layers of FIG. 2 with the crosspoints of all twelve wires represented by conductor H0, for example, having their clamping windings paralleled whereby the closure of contacts SH0 and SV0 would interconnect the twelve wires H0 to the twelve wires V0.

FIG. 3 discloses a switch of this type having two rows, three columns and two levels. Crosspoints 00L1, 01L1, and 02L1 comprise row 0 of level 1 while crosspoints 00L0, 01L0, and 02L0 comprise row 0 of level 0. Similarly, crosspoints 10L1, 11L1, and 12L1 comprise row 1 of level 1 while crosspoints 10L0, 11L0, and 12L0 comprise row 1 of level 0. The crosspoints of row 0, level 1 have conductor H0L1 as their signal input while the crosspoints in row 0, level 0 have conductor H0L0 as their signal input. Similarly, conductors H1L1 and H1L0 comprise the signal input conductors of levels 1 and 0, respectively of row 1. The output conductors for column 0 are designated V0L1 for level 1 and V0L0 for level 0. The output conductors for the other columns are designated in a corresponding manner.

Control conductor CH0 is common to the crosspoints in both levels 0 and 1 of row 0 while control conductor CH1 is common to the crosspoints in levels 0 and 1 of row 1. Similarly, conductors CV1, CV0, and CV2 are common to the crosspoints in both levels of columns 0, 1, and 2, respectively.

The clamping winding of each crosspoint is connected in series with a diode between the control conductor common to its row and the control conductor common to its column. The closure of contacts SH0 and SV0, for example, followed by the release of contacts SV0 effect a clamping current through both of crosspoints 00L0 and 00L1 thereby linking the two signal windings of both of these crosspoints fluxwise whereupon conductors H0L0 and H0L1, respectively, may communicate with conductors V0L0 and V0L1, respectively. Other crosspoints are closed in a similar manner.

It is to be understood that the above-described arrangements are but illustrative of the application of the principles of the invention. Numerous other arrangements may be devised by those skilled in the art without departing from the spirit and scope of the invention. For example, the crosspoint elements utilized herein may be of material having a substantially rectangular hysteresis loop. This material would normally be utilized only when it is desired to take advantage of its memory capabilities. When such material is used in the circuit of FIG. 2, it would operate in the following manner. Switches SH1 and SV1 would be operated momentarily in order to effect a breakdown of diode D11 and thereby orient the flux in the middle rung of crosspoint 11 in a given direction. The flux will remain oriented in this direction upon the release of these two switches until altered by a subsequently applied flux.

At this time, only the middle rung of crosspoint 11 has its flux oriented in the direction of the previously applied clamping current. If a pulse is now applied to conductor H1, a signal flux is induced in the top rung of each crosspoint in row 1. If the pulse applied to conductor H1 is of the proper polarity, only the signal flux in crosspoint 11 will travel through the bottom rung and induce a corresponding signal in the winding associated therewith since the flux induced in the other crosspoints of row 1 will complete a return path for itself through their associated middle rungs.

If the crosspoints of FIG. 2 are of material having remanent magnetic properties and, if the memory capabilities of the resulting embodiment are to be utilized, means must be provided for selectively reorienting the flux in each crosspoint to its original condition. This means may advantageously comprise a reset winding encircling one of the side rails of each crosspoint with the reset windings for all crosspoints in a row being connected in series as are the top rung signal windings. In this manner, the application of a reset pulse to the reset circuit for a row resets all crosspoints within the row. Suitable reset circuits are shown in the aforementioned T. H. Crowley et al. patent.

What is claimed is:

1. A matrix switch having a plurality of crosspoints arranged into columns and rows, each of said crosspoints comprising a magnetic element having a first and a second signal winding which are normally not flux connected, a clamping winding on each crosspoint effective when current flows therethrough to link the two signal windings of its crosspoint fluxwise, means for connecting the first signal windings of all crosspoints common to a row in series between ground and a signal lead individual to each row, means for connecting the second signal windings of all crosspoints common to a column in series between ground and a signal lead individual to each column, means for effecting a current in only the clamping winding of a selected crosspoint whereby the signal lead for the row in which said selected crosspoint is located is connected signalwise with the signal lead of the column in which said selected crosspoint is located.

2. A matrix switch having a plurality of crosspoints arranged into columns and rows, each crosspoint comprising a multiapertured magnetic structure having a primary and secondary flux leg which are normally non-flux connected and a bypass flux leg which is normally flux connected to said primary flux leg, said magnetic structure also being dimensioned whereby all flux paths therewith have substantially the same flux capacity, a first signal winding on said primary leg, a clamping winding on said bypass leg, a second signal winding on said secondary leg, said clamping winding being effective when current flows therethrough to link the two signal windings of its crosspoint fluxwise, a first group of signal conductors each of which is individually associated with one of said rows, a second group of signal conductors each of which is individually associated with one of said columns, means for connecting the first signal windings of the crosspoints common to each row between a common ground and the signal conductor individual to each row, means for connecting the second signal windings of the crosspoints common to each column between a common ground and a signal conductor individual to each column, and means for effecting a current through only the clamping winding of a selected crosspoint whereby only the conductors common to said selected crosspoint are interconnected signalwise.

3. A matrix switch having a plurality of crosspoints arranged into columns and rows, each crosspoint comprising a multiapertured magnetic structure having a primary and secondary flux leg which are normally non-flux connected and a bypass flux leg which is normally flux connected to said primary flux leg, said magnetic structure also being dimensioned whereby all flux paths therewithin have substantially the same flux capacity, a first signal winding on said primary leg, a clamping winding on said bypass leg, a second signal winding on said secondary leg, said clamping winding being effective when current flows therethrough to link the two signal windings of its crosspoint fluxwise, a first group of signal conductors each of which is individually associated with one of said rows, a second group of signal conductors each of which is individually associated with one of said columns, means for connecting the first signal windings of the crosspoints common to each row between a common ground and the signal conductor individual to each row, means for connecting the second signal windings of the crosspoints common to each column between a common ground and a signal conductor individual to each column, a first group of control conductors each of which is individually associated with ones of said rows, a second group of control conductors each of which is individually associated with one of said columns, means for interconnecting the clamping winding of each crosspoint between the control conductor for its column and the control conductor for its row, and means for applying a potential difference between a selected control conductor in said first group and a selected control conductor in said second group to effect a current through only the clamping winding of the crosspoint common to said selected conductors whereby only the signal conductors common to said last-named crosspoint are connected signalwise.

4. A matrix switch having a plurality of crosspoints arranged into columns and rows, each crosspoint comprising a multiapertured magnetic structure having a primary and secondary flux leg which are normally non-flux connected and a bypass flux leg which is normally flux connected to said primary flux leg, said magnetic structure also being dimensioned whereby all flux paths therewithin have substantially the same flux capacity, a first signal winding on said primary leg, a clamping winding on said bypass leg, a second signal winding on said secondary leg, said clamping winding being effective when current flows therethrough to link the two signal windings of its crosspoint signalwise, a first group of control conductors each of which is individually associated with one of said rows, a second group of control conductors each of which is individually associated with one of said columns, means for interconnecting the clamping winding of each crosspoint between the control conductor for its column and the control conductor for its row, means for applying a potential difference between a selected control conductor in said first group and a selected control conductor in said second group to effect a current through only the clamping winding of the crosspoint common to said selected conductors whereby only its signal windings are interconnected signalwise.

5. A three-dimensional matrix switch having a plurality of crosspoints divided into levels with each level having columns and rows, each of said crosspoints comprising a magnetic element having a first and a second signal winding which are normally non-flux connected, a clamping winding on each crosspoint effective when current flows therethrough to link the two signal windings of its crosspoint fluxwise, a first group of control conductors each of which is individually associated with a different row in one of said levels and each of which is common to the corresponding row in each level, a second group of control conductors each of which is individually associated with a different column in one of said levels and each of which is common to the corresponding column in each level, means for interconnecting the clamping winding of each crosspoint between the control conductors common to its row and column, and means for applying a potential difference between a selected control conductor in said first group and a selected control conductor in said second group to effect a current in only the clamping windings of all crosspoints common to said selected conductors thereby linking fluxwise the two signal windings on only each of said last-named crosspoints.

6. A three-dimensional matrix switch having a plurality of crosspoints divided into levels with each level having columns and rows, each crosspoint comprising a multiapertured magnetic structure having a primary and secondary flux leg which are normally non-flux connected and a bypass flux leg which is normally flux connected to said primary flux leg, said magnetic structure also being dimensioned whereby all flux paths within said structure have substantially the same flux capacity, a first signal winding on said primary leg, a clamping winding on said bypass leg, a second signal winding on said secondary leg, said clamping winding being effective when current flows therethrough to link the two signal windings of its crosspoint signalwise, a first group of control conductors each of which is individually associated with a different row in one of said levels and each of which is common to the corresponding row in each level, a second group of control conductors each of which is individually associated with a different column in one of said levels and each of which is common to the corresponding column in each level, means for interconnecting the clamping winding of each crosspoint between the control conductors common to its row and column, and means for applying a potential difference between a selected control conductor in said first group and a selected control conductor in said second group to effect a current in only the clamping windings of the crosspoints common to both of said selected control conductors thereby linking fluxwise the two signal windings on only each of said last-named crosspoints.

7. A matrix switch having a plurality of crosspoints arranged into columns and rows, each crosspoint comprising a multiapertured magnetic structure having a first and second signal winding which are normally non-flux connected, each of said structures also having a clamping winding which is effective when current flows therethrough to link the two signal windings of its crosspoint fluxwise, a first group of signal conductors each of which is individually associated with one of said rows, a second group of signal conductors each of which is individually associated with one of said columns, means for connecting the first signal windings of the crosspoints common to each row between a common ground and the signal conductor individual to each row, means for connecting the second signal windings of the crosspoints common to each column between a common ground and a signal conductor individual to each column, a first group of control conductors each of which is individually associated with one of said rows, a second group of control conductors each of which is individually associated with one of said columns, means for interconnecting the clamping winding of each crosspoint between the control conductor for its column and the control conductor for its row, means for applying a potential difference between a selected cntrol conductor in said first group and a selected control conductor in said second group to effect a current through only the clamping winding of the crosspoint common to said selected control conductors whereby only the signal conductors common to said last-named crosspoint are interconnected signalwise.

8. A matrix switch having a plurality of crosspoints arranged into columns and rows, each crosspoint comprising a multiapertured magnetic element having a first and a second signal winding which are normally nonconnected signalwise, a first group of signal conductors each of which is individually associated with one of said rows, a second group of signal conductors each of which is individually associated with one of said columns, means for connecting the first signal windings of the elements common to each row between a common ground and the signal conductor individual to each row, means for connecting the second signal windings of the elements common to each column between a common ground and the signal conductor individual to each column, a clamping winding on each of said elements effective when current flows therethrough to link the signal windings of its element signalwise, and means for effecting a current in the clamping winding of only a selected one of said elements whereby only the conductor in said first group and the conductor in said second group associated with said selected element are interconnected signalwise as long as said clamping current persists.

9. A matrix switch having a plurality of crosspoints arranged into columns and rows, each of said crosspoints comprising a magnetic element having a first and second signal winding which are normally non-flux connected, a clamping winding on each crosspoint effective when current flows therethrough to link the two signal windings of its crosspoint fluxwise, a first group of control conductors each of which is individually associated with one of said rows, a second group of control conductors each of which is individually associated with one of said columns, a plurality of diodes each of which interconnects the clamping winding of a crosspoint between the control conductor for its row and the control conductor for its column, means for connecting fluxwise the windings of a selective element by applying a potential difference between the control conductor for the row containing said selected element and the control conductor for the column containing said selected element thereby effecting a current in the clamping winding of said selected element.

*10. A matrix comprising first and second conductor multiples connected to define intersecting crosspoints, switching means for controlling the transmission of information signals through each of said crosspoints between the conductor multiples common thereto, memory means at each of said crosspoints, means including the conductor multiples common to any selected crosspoint for concurrently applying a first and second control signal to the memory means thereat, and means responsive to said application for enabling said switching means to pass information signals through said selected crosspoint as long as both of said control signals remain applied by said multiples.*

*11. A matrix comprising first and second conductor multiples connected to define intersecting crosspoints, a magnetic element at each of said crosspoints for controlling the transmission of information signals through each of said crosspoints between the conductor multiples common thereto, a first and a second normally nonflux-connected signal winding on each of said magnetic elements, memory means at each of said crosspoints, means including the conductor multiples common to any selected crosspoint for concurrently applying a first and second control signal to the memory means thereat, and means responsive to said application for flux-connecting the signal windings of the magnetic element at said selected crosspoint, said signal windings of said magnetic element being effective to pass information signals between the multiples common to its crosspoint as long as control signals are applied to said memory means by both multiples common thereto.*

References Cited

The following references, cited by the Examiner, are of record in the patented file of this patent or the original patent.

UNITED STATES PATENTS

| | | | |
|---|---|---|---|
| 2,218,711 | 10/1940 | Hubbard | 323—56 |
| 2,578,701 | 12/1951 | Hecht | 179—18.7 |
| 2,740,949 | 4/1956 | Counihan | 340—166 |
| 2,753,510 | 7/1956 | Smith | 323—56 |
| 2,814,031 | 11/1956 | Davis | 340—166 |
| 2,840,801 | 6/1958 | Beter | 340—166 |
| 2,869,112 | 1/1959 | Hunter | 340—174 |
| 2,881,414 | 4/1959 | Haynes | 340—174 |
| 2,898,581 | 8/1959 | Post | 340—174 |
| 2,923,923 | 2/1960 | Raker | 340—166 |
| 2,926,342 | 2/1960 | Rogers | 340—174 |
| 2,931,017 | 3/1960 | Bonn | 340—166 |

KATHLEEN H. CLAFFY, *Primary Examiner.*

L. A. WRIGHT, *Assistant Examiner.*